United States Patent
Albrow et al.

[11] Patent Number: 5,834,946
[45] Date of Patent: Nov. 10, 1998

[54] INTEGRATED CIRCUIT TEST HEAD

[75] Inventors: Robert Albrow, Del Mar; Bert Klugkist, Northridge, both of Calif.

[73] Assignee: Mosaid Technologies Incorporated, Kanata, Canada

[21] Appl. No.: 961,412

[22] Filed: Oct. 30, 1997

Related U.S. Application Data

[63] Continuation of Ser. No. 545,120, Oct. 19, 1995, abandoned.

[51] Int. Cl.[6] ....................................................... G01R 1/02
[52] U.S. Cl. ............................................................. 324/760
[58] Field of Search ...................................... 324/760, 765, 324/73.1, 158.1; 165/80.3, 80.4, 80.5; 361/702, 714, 718

[56] References Cited

U.S. PATENT DOCUMENTS

| | | |
|---|---|---|
| 4,517,512 | 5/1985 | Petrich et al. .......................... 324/754 |
| 4,590,538 | 5/1986 | Cray, Jr. ................................... 361/385 |
| 4,880,050 | 11/1989 | Nakamura et al. ....................... 165/41 |
| 4,962,444 | 10/1990 | Niggemann ............................ 165/80.4 |
| 5,153,815 | 10/1992 | Suzuki et al. .......................... 165/80.3 |
| 5,216,361 | 6/1993 | Akar et al. .............................. 324/761 |

*Primary Examiner*—Vinh P. Nguyen
*Attorney, Agent, or Firm*—Pascal & Associates

[57] ABSTRACT

An integrated circuit test head assembly includes a group of circuit modules arranged in a circle, with the heat sinks carried by each of the modules located on the outside of the circle. The circuit modules are contained within a test head housing. Conductive pins extend downwardly from each of the modules and contact a probe card directly, without the need for an adapter. The circuit boards are cooled by flowing a cooling medium, typically a gas, around the outside of the circle of modules, so that all of the heat sinks are evenly cooled.

8 Claims, 5 Drawing Sheets

INTEGRATED CIRCUIT TEST HEAD

This is a file wrapper continuation under 37 CFR 1.62 of application Ser. No. 08/545,120, filed Oct. 19, 1995, abandoned.

FIELD OF THE INVENTION

This invention relates to a test head for an integrated circuit tester.

BACKGROUND TO THE INVENTION

An integrated circuit tester is a device which presents probes to the surface of an integrated circuit wafer, and as a result of signals injected and retrieved from the integrated circuit via the probes, provides information that can be used to indicate the operability of an integrated circuit. The elements of the tester that contains the electronic circuit boards that interface to an integrated circuit by means of probes is called a "test head".

FIG. 1 illustrates an exploded isometric view of a teat head for an integrated circuit tester. A wafer 1 to be tested is supported on a chuck 3 which can be moved in any of three orthogonal directions x, y and z, in order to position the integrated circuit under and into contact with appropriate probes. A prober table 5 contains an orifice 7 within which a pogo ring adapter 9 sits. A probe card 11 is attached to the bottom of the ring, which carries on its lower surface (not shown), a plurality of fine conductors for contact with the surface of the wafer.

A test head 13 contains a plurality of circuit boards which support test electronic circuits and/or electronic drivers and receivers circuitry, and also support pins 15 which are connected to the electronic circuits. The pins extend downwardly toward the probe card 11.

FIG. 2 is an isometric view of the inside of the test head 13, the exterior of the test head being shown partly in phantom. The circuit boards are shown as elements 17. These circuit boards, besides carrying electronic circuitry, also carry heat sinks 19. The circuit boards with their heat sinks are disposed in a star configuration as shown, a representative top view being shown in FIG. 2A.

As may be seen in FIG. 1, due to the star configuration of the circuit boards, the connector pins 15 extend over a large area, significantly larger than the area of the probe card. For that reason an adapter 21 is used, which has a diameter greater than the diametric distance between opposite connector pins. The adapter 21 has conductive pads on its upper surface which contact the contacts 15 of the circuit boards, which connect to conductive pads on its lower surface which contact the pogo pins 23 contained in the ring adapter 9. The diametric distance between opposite pogo pins is slightly smaller than the diameter of the probe card. The location of the pogo pins coincides with contacts on the upper surface of the probe card, which contacts are connected to probe wires supported on its lower surface.

The adapter card thus performs the function of reducing the diameter of the connector pins 15 to the smaller diameter of the pogo pins 23 whose ring adapter 9 is of a size to fit the orifice 7 of a standard table 5. The pogos perform the function of extending the cards to and from the circuit boards, via the adapter 21, up and down through the orifice of the table in order to connect via the probe card 11 to the integrated circuit. The pogos are typically 1.5 to 2 inches in length.

In order to cool the circuit cards air is blown down or is sucked up from the test head, the air picking up heat from the heat sinks.

It has been found that due to the space congestion caused by the heat sinks 19 and circuit boards 17, the circuit boards and heat sinks are not cooled adequately, and the cooling which is done results in differential cooling, the portions of the circuit boards and the heat sinks located away from the axis of the test head being cooled more than the portions of the circuit boards and the heat sinks located close to the axis of the test head. This has caused premature failure of the circuit boards, intermittent operation, and unreliable performance.

SUMMARY OF THE INVENTION

The present invention is a test head which, unlike the prior art structures described above, provides the means by which the test circuitry itself extends down through the probe table orifice, minimising the distance between the test circuitry and the integrated circuit to be tested. This diminishes the need for adapters and pogo rings as is required in the prior art structure. The present structure maximises test performance and test rate, requires no adapters and thereby saves cost and improves reliability.

The present invention is a test head which provides even cooling of heat sinks and test circuitry contained within a test head, and thus results in a more reliable and longer lived test head than in the prior art described above.

In the present invention, test circuit cards supporting heat sinks are disposed in a circle around the interior of the test head. The heat sinks are disposed to the outside of the circle. Pogo pins are supported by the circuit boards and extend downwardly in a circle which is within the diameter of the probe card. As a result, the pogo pins of the circuit boards directly contact the probe card, and no adapter is required.

The heat sinks are located outside the diameter of the probe card, and with the housing of the test head of larger diameter than the outside diameter between opposite heat sinks, air is blown or sucked past the heat sinks outside the circle containing the circuit boards within the housing, providing very efficient and even cooling of the heat sinks and circuit boards.

In accordance with an embodiment of the invention, a test head assembly is comprised of a plurality of circuit modules mounted in a circle, contained within a test head housing, conductive pins extending downwardly in the same direction from each of the modules, heat sinks supported by the modules, extending radially outwardly from the circle, and spaced from the test head housing, and apparatus for flowing a cooling medium within the housing, outside of the modules and past the heat sinks.

In accordance with another embodiment, a probe card having a diameter of approximately the diameter of the circle is disposed coaxial with the circle. The probe card has contacts on its upper surface in contact with the conductive pins, and has a lower surface which supports probe wires which are connected to the contacts.

The modules can be circuit boards the plane of each being approximately parallel to the axis of the circle

BRIEF INTRODUCTION TO THE DRAWINGS

A better understanding of the invention will be obtained by reading the description of the invention below, with reference to the following drawings, in which:

FIG. 1 is an isometric view of an integrated circuits test head in accordance with the prior art, FIG. 2 is an isometric view of the interior of the test head of the tester of FIG. 1, FIG. 2A is a top view of he interior of the test head of the tester of FIG. 1, FIG. 3 is an isometric view of the interior of a tester in accordance with the present invention, FIG. 4A is an isometric view of the interior of a test head, partly in phantom, in accordance with the present invention, FIG. 4B is a top view of a test head in accordance with the present invention, FIG. 4C is a side view of the test head of FIG. 4A, and FIG. 5 is a side view of the tester in accordance with another embodiment.

DETAILED DESCRIPTION OF PREFERRED EMBODIMENT

Figure 1:
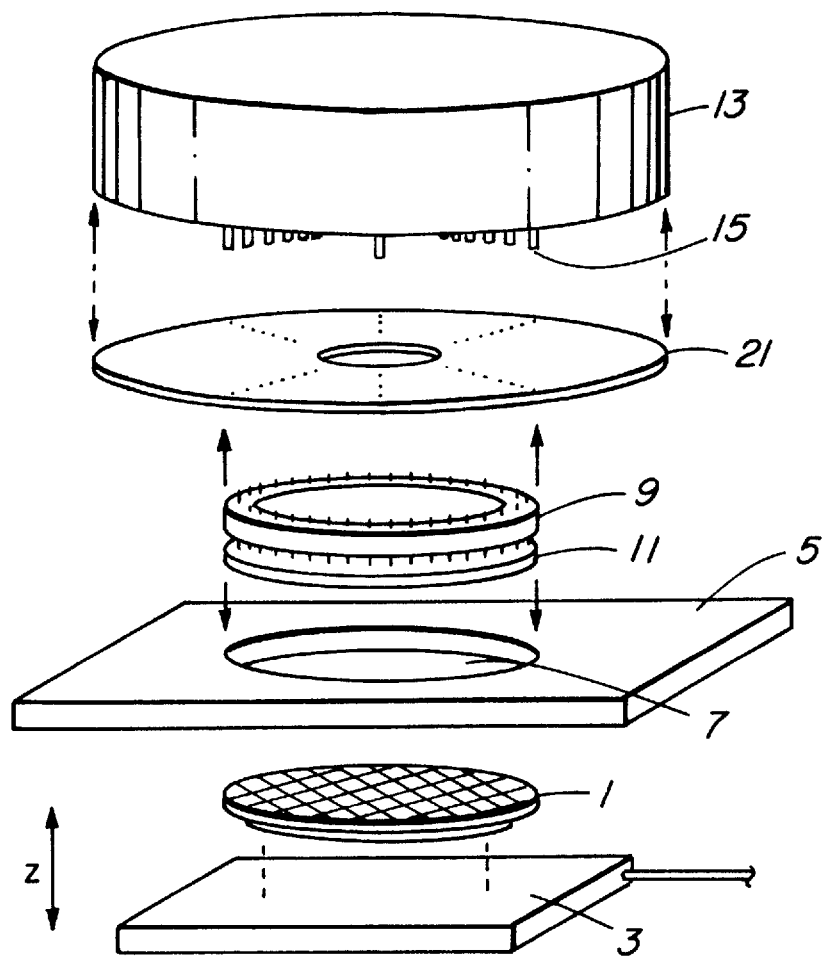
Figure 2:
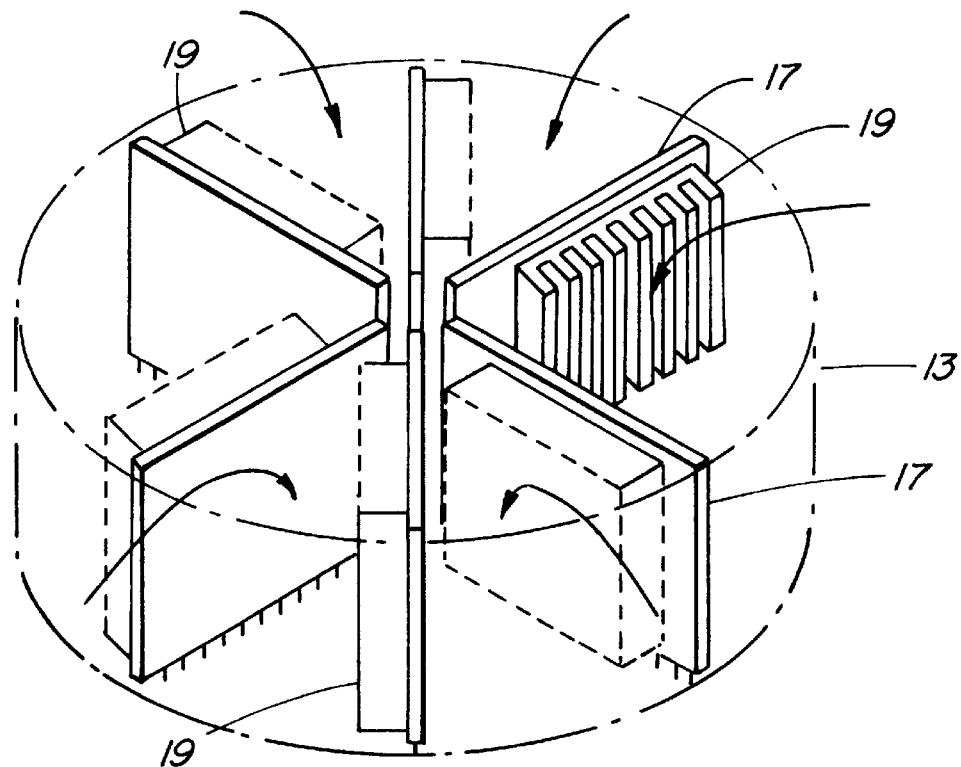
Figure 2A:
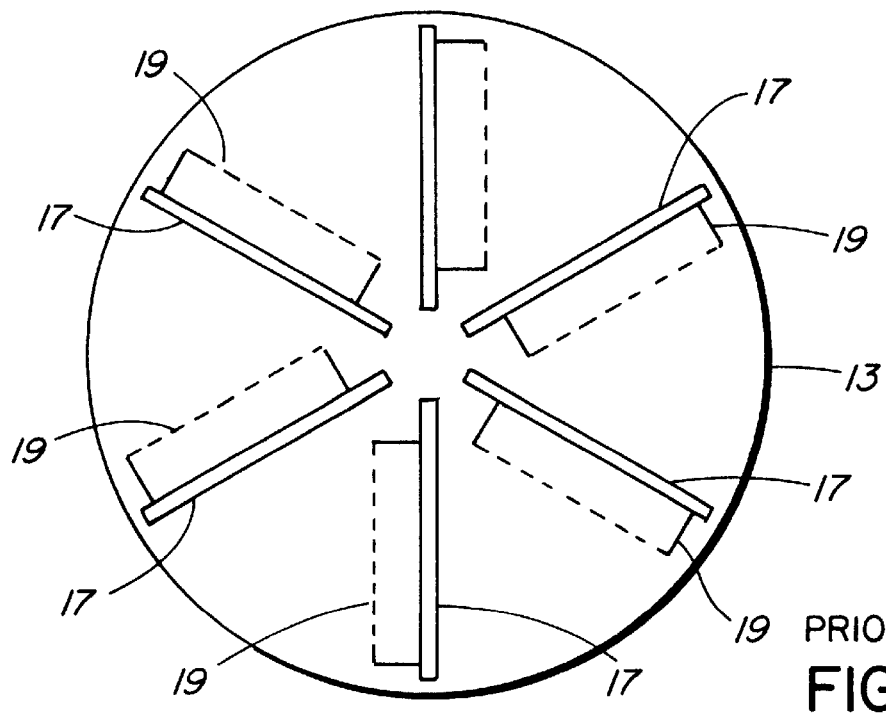
Figure 3:
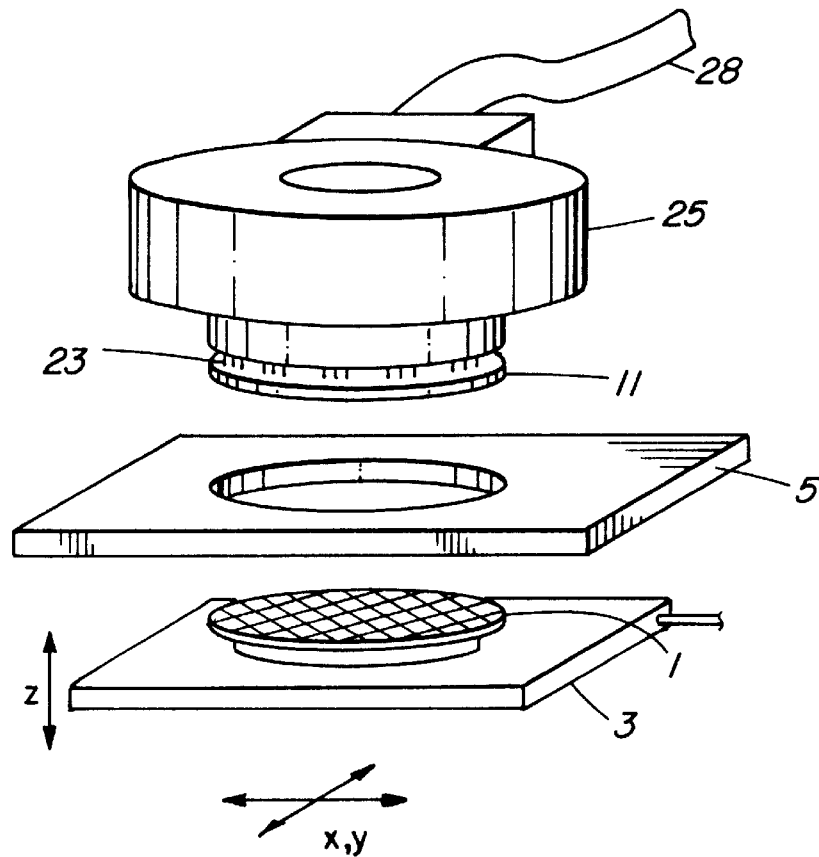

Turning to FIGS. 3, 4A, 4B and 4C, the wafer 1, chuck 3 and prober table 5 are similar to those in the prior art as described above. However the test head 25 in the present invention contains circuit boards 27 which carry the test circuitry and/or signal transmitters and receivers arranged in a circle within the test head, as shown in FIG. 4. A cable or cables 28 carry signals to and from the circuit boards to external circuitry.

The circuit boards 27 carry heat sinks 29, which are disposed radially outwardly relative to the axis of the cylindrical test head. The outer periphery of the test head is spaced from the outer edges of the heat sinks.

Figure 4A:
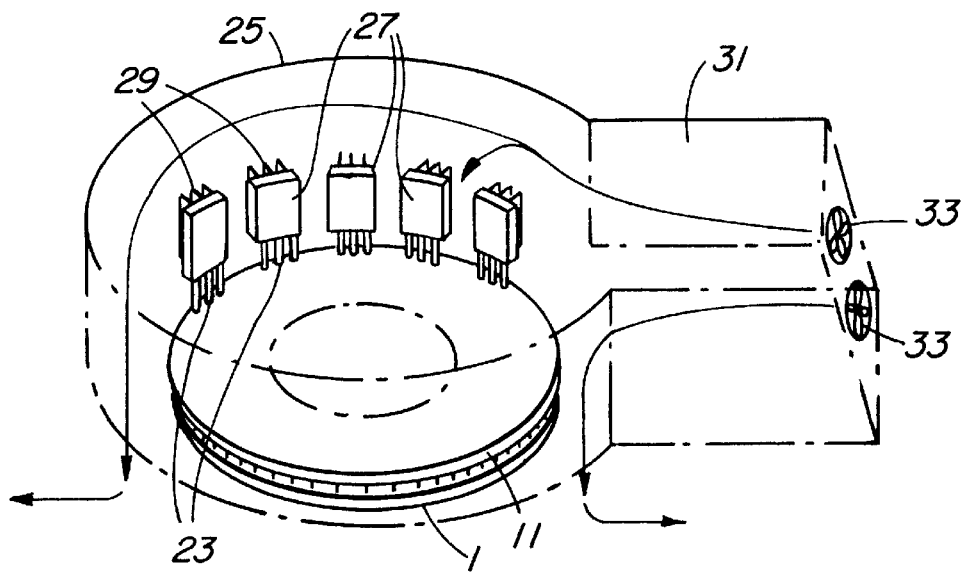
Figure 4C:
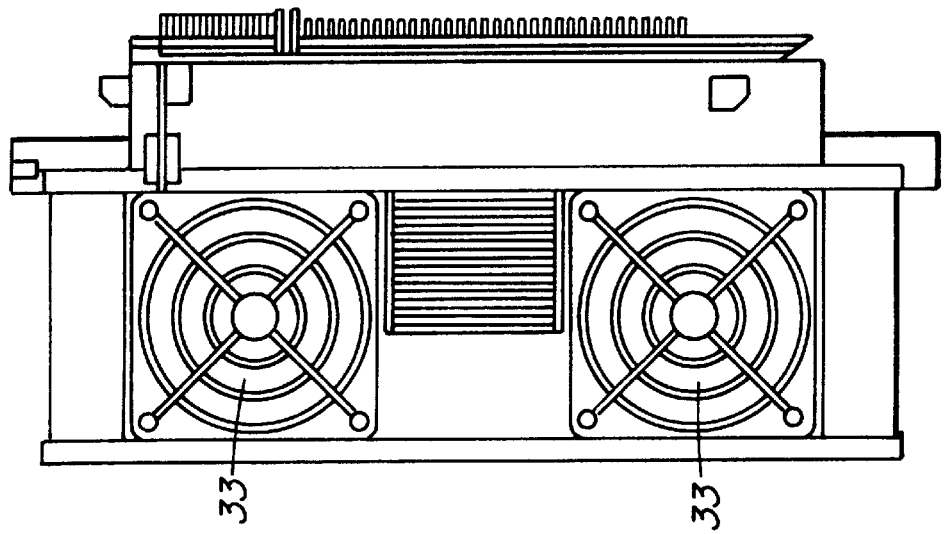
Figure 4B:
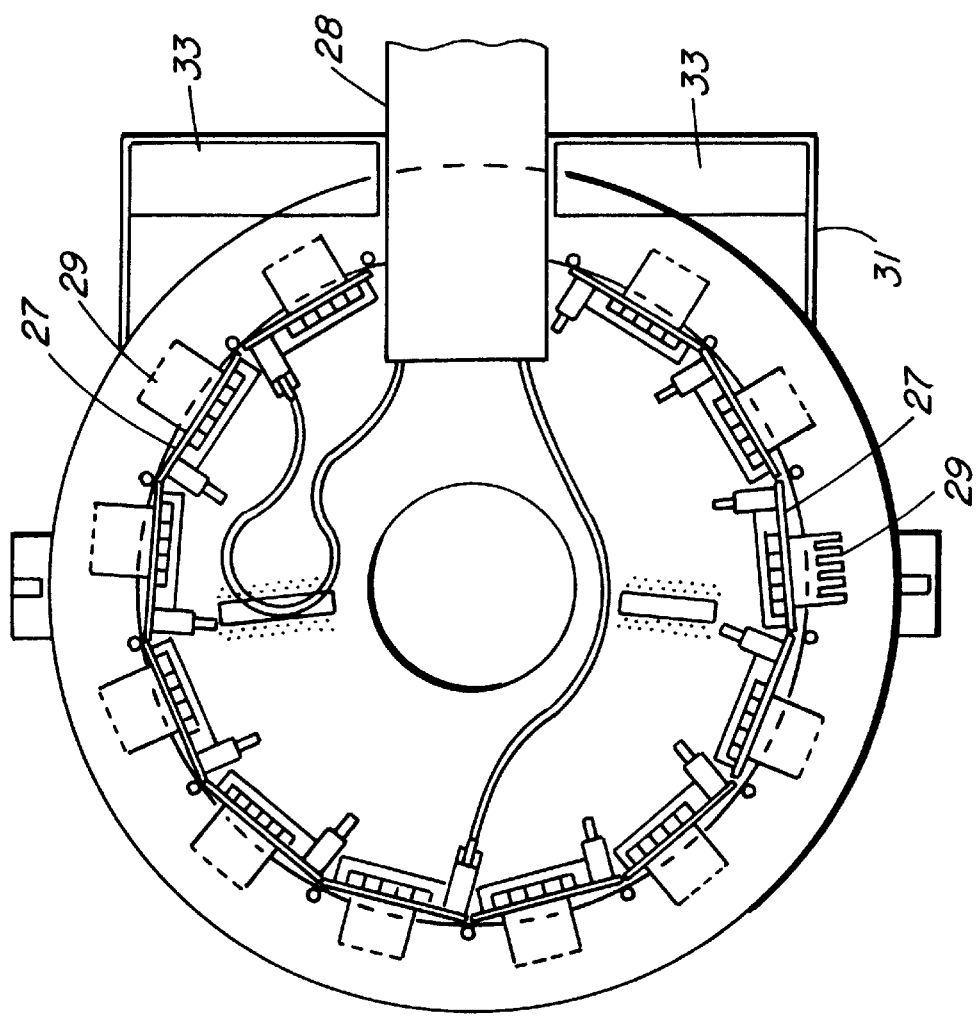

A plenum 31 is connected to the test head, and in an embodiment as shown in FIG. 4B, the plenum carries at least one, and preferably a pair of fans for forcing cooling air or another cooling gas to pass through the test head and past the heat sinks. The air passes into or out of the bottom of the test head, since it is wider than the probe card. In another embodiment, the bottom of the test head can be closed (or can be blocked by the prober table when the probe card is in position), and one fan can blow into the test head while the other fan sucks air from the test head, thus circulating air around the outside of the heat sinks within the test head.

In any of the above structural forms, the heat sinks are thereby cooled. Importantly, since the heat sinks are equally spaced from each other and from the test head peripheral boundary, each is similarly cooled. Differential cooling and inadequate cooling is thus avoided.

Further, since the circuit boards are located in a circle, there is no need to extend the circuit board lengths as in the prior art system so as to avoid the circuit boards and heat sinks touching each other adjacent the axis of the test head, which results in the circuit board pins extending outwardly far past the periphery of the probe card. This prior art structure is one reason why the adapter 21 is required.

In the present invention, since the circuit boards have no reason to be extended, the pins all are contained within the periphery of the probe card, and no adapter corresponding to adapter 21 is required. This reduces cost, results in a smaller test head, and avoids the need for an extra contact, increasing reliability of the structure.

Figure 5:
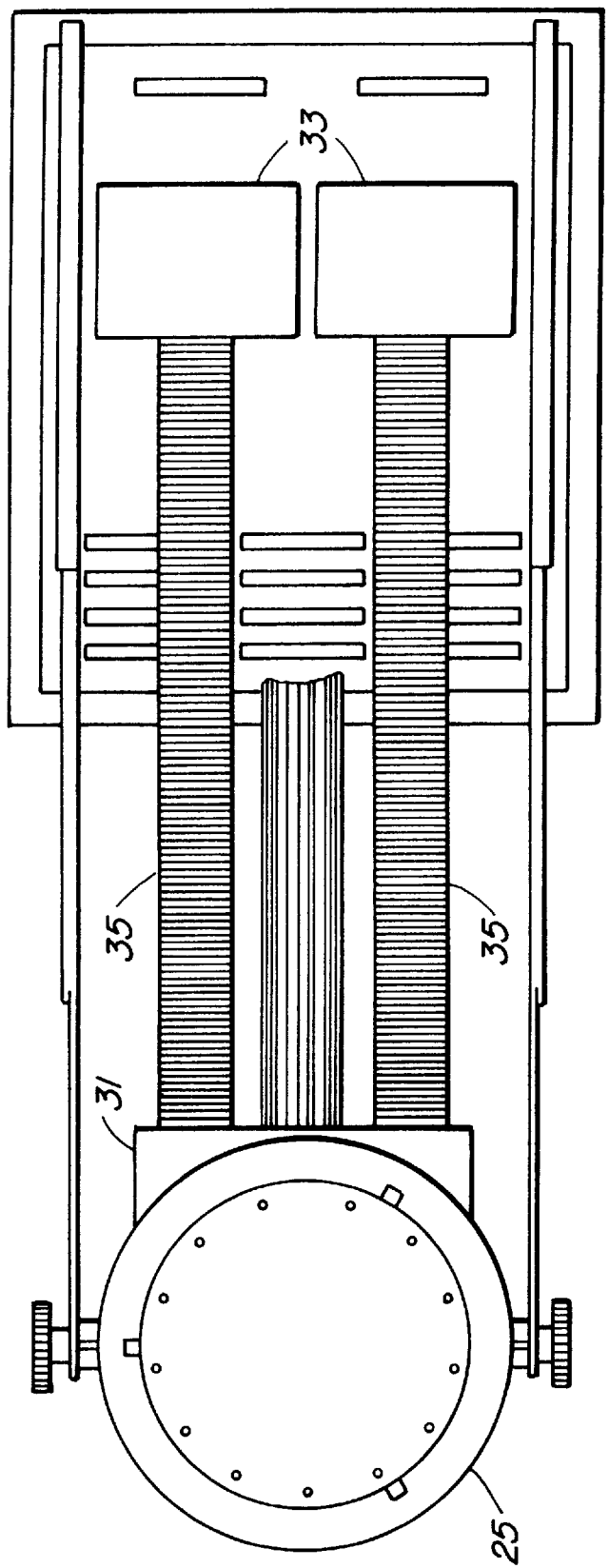

FIG. 5 is a side view of the test head of the present invention in accordance with another embodiment. In this embodiment, the fans 33 are located at the end of a pair of preferably telescoping air hoses 35, which are coupled to holes in the plenum 31. This structure fans to be changed easily to accommodate different allows cooling air flow requirements, without disturbing the probe head, and as well allows the air hoses to isolate the probe head from vibrations generated by the fans.

A person understanding this invention may now conceive of alternative structures and embodiments or variations of the above. All of those which fall within the scope of the claims appended hereto are considered to be part of the present invention.

We claim:

1. An integrated circuit test head comprising:
   (a) a plurality of circuit modules mounted in a circle within a test head housing, broad plane surfaces of the circuit modules being disposed approximately tangential to the circle;
   (b) conductive pins extending downwardly in the same direction from each of the modules;
   (c) heat sinks supported by the modules and extending radially outwardly from the circle; and
   (d) means for flowing a cooling medium within the housing outside the circle of modules and past the heat sinks.

2. An assembly as defined in claim 1, further comprising a probe card having a diameter of approximately the diameter of the circle being disposed coaxial with the circle, the probe card having contacts on its upper surface in contact with said conductive pins, the probe card having a lower surface which supports probe wires which are connected to said contacts.

3. An assembly as defined in claim 2 further comprising a plenum in communication with a side of said housing for guiding said cooling medium into said housing.

4. An assembly as defined in claim 3 further comprising at least one fan for blowing or sucking said cooling medium into or from said plenum.

5. An assembly as defined in claim 4 further including at least one hose in communication with said plenum, said at least one fan being located at a remote end of said at least one hose.

6. An assembly as defined in claim 3 further comprising a pair of fans, one fan rotating so as to blow cooling medium into the plenum and another fan rotating so as to suck air from the plenum.

7. An assembly as defined in claim 3 further including a pair of hoses in communication with said plenum, a fan at a remote end of each of the hoses, one fan rotating so as to blow cooling medium into the plenum and another fan rotating so as to suck air from the plenum.

8. An assembly as defined in claim 3, in which the modules are circuit boards, the plane of each of the circuit boards being approximately parallel to the axis of the circle.

* * * * *